United States Patent
Wang et al.

(10) Patent No.: US 10,809,328 B2
(45) Date of Patent: Oct. 20, 2020

(54) HIGH DENSITY MAGNETIC RESONANT IMAGING GRADIENT DRIVER WITH INTEGRATED COOLING

(71) Applicant: General Electric Company, Schenectady, NY (US)

(72) Inventors: Ruxi Wang, Cohoes, NY (US); Juan Antonio Sabate, Gansevoort, NY (US); Gary Dwayne Mandrusiak, San Diego, CA (US); Kevin Patrick Rooney, Pewaukee, WI (US); Karthik Kumar Bodla, Watervliet, NY (US)

(73) Assignee: General Electric Company, Schenectady, NY (US)

( * ) Notice: Subject to any disclaimer, the term of this patent is extended or adjusted under 35 U.S.C. 154(b) by 83 days.

(21) Appl. No.: 16/164,137

(22) Filed: Oct. 18, 2018

(65) Prior Publication Data

US 2020/0124688 A1    Apr. 23, 2020

(51) Int. Cl.
| | | |
|---|---|---|
| *G01R 33/38* | (2006.01) | |
| *H01F 27/02* | (2006.01) | |
| *G01R 33/385* | (2006.01) | |
| *H01F 27/10* | (2006.01) | |
| *H01F 27/32* | (2006.01) | |
| *H01F 27/06* | (2006.01) | |

(52) U.S. Cl.
CPC ......... *G01R 33/385* (2013.01); *H01F 27/025* (2013.01); *H01F 27/06* (2013.01); *H01F 27/10* (2013.01); *H01F 27/325* (2013.01)

(58) Field of Classification Search
CPC ............................. G01R 33/385; H01F 27/025
USPC ......................................................... 324/307
See application file for complete search history.

(56) References Cited

U.S. PATENT DOCUMENTS

| | | | |
|---|---|---|---|
| 5,554,929 A | 9/1996 | Doty | |
| 6,441,614 B1* | 8/2002 | Edelstein | G01R 33/3856 324/307 |
| 7,180,292 B2 | 2/2007 | Coughlin et al. | |
| 7,626,477 B2* | 12/2009 | Huang | H01F 6/04 324/319 |

(Continued)

FOREIGN PATENT DOCUMENTS

WO    9737240 A1    10/1997

OTHER PUBLICATIONS

Urdaneta et al., "Goodbye wires and formers: 3-D additive manufacturing and fractal cooling applied to construction of MRI gradient coils", 2011 IEEE Nuclear Science Symposium Conference Record, Valencia, Spain, pp. 2479-2482, Oct. 23-29, 2011.

(Continued)

*Primary Examiner* — Reena Aurora

(57) ABSTRACT

Embodiments of the present disclosure include an inductor including at least one inductor coil, the at least one inductor coil including a plurality of outer longitudinal portions aligned around an outer periphery of the inductor, and a plurality of inner longitudinal portions aligned around an interior of the inductor. The plurality of outer longitudinal portions and the plurality of inner longitudinal portions collectively form two width-wise sides of the inductor and two length-wise sides of the inductor. The two width-wise sides and the two lengthwise sides define a substantially rectangular prism shape. The two width-wise sides and the two lengthwise sides define a hollow inductor core.

20 Claims, 11 Drawing Sheets

(56) References Cited

U.S. PATENT DOCUMENTS

| | | |
|---|---|---|
| 8,760,164 B2 | 6/2014 | Rivas Davila et al. |
| 9,246,373 B2 * | 1/2016 | Zirin .................. H02K 3/24 |
| 9,869,734 B2 | 1/2018 | Mathieu et al. |
| 2009/0174407 A1 | 7/2009 | Han et al. |
| 2015/0078054 A1 * | 3/2015 | Myhre ................ H01F 17/06 |
| | | 363/140 |
| 2015/0145624 A1 | 5/2015 | Weinberg et al. |
| 2017/0192067 A1 | 7/2017 | Garcia et al. |
| 2018/0372819 A1 * | 12/2018 | Wang .................. G01R 33/36 |

OTHER PUBLICATIONS

Rigla et al., "Design and additive manufacturing of MRI gradient coils", 2014 IEEE Nuclear Science Symposium and Medical Imaging Conference (NSS/MIC), Seattle, WA, USA, pp. 1-4, Nov. 8-15, 2014.

* cited by examiner

HIGH DENSITY MAGNETIC RESONANT IMAGING GRADIENT DRIVER WITH INTEGRATED COOLING

BACKGROUND

The subject matter disclosed herein relates to magnetic resonance imaging systems and, more particularly, to gradient driver cooling configurations in a magnetic resonance imaging system.

The use of medical imaging technologies has become commonplace in the medical community. Such imaging technologies typically allow the acquisition of images which depict the internal structures (internal tissues and organs, bones, and so forth) and/or biochemical functions of a patient without the use of invasive procedures. That is, medical imaging technologies typically allow the internal structures and/or functions of a patient to be observed without surgery or other invasive procedures.

One such medical imaging technology is known as magnetic resonance imaging (MRI). MRI systems typically employ magnetic fields and pulses of radio frequency (RF) energy to generate images based on the gyromagnetic properties of tissues and structures within the body. For example, MRI systems may employ a primary magnetic field to generally orient susceptible molecules (such as hydrogen nuclei in water molecules) within the field and a RF pulse to disrupt this orientation. The reorientation of molecules within the primary magnetic field after this disruption may generate signals that may be detected and used to generate images of the internal structures and/or functions within the patient. Time-varying magnetic gradient fields may also be applied to the subject so that the generated signals may be localized with respect to x-, y-, and z-axes, allowing an image to be generated.

The time-varying magnetic gradient fields may be produced by gradient coils in the MRI system which are driven by pulsed sequences of current having a large dynamic range. The pulsed sequences are typically delivered to the gradient coils by gradient drivers in the MRI system. A gradient driver generally includes an array of semiconductors connected in series and/or parallel which may be stacked to drive a higher amplitude pulse sequence. However, typical configurations of gradient drivers may result in thermal instability and/or electrical losses which decreases the efficiency and/or complicates the design of the MRI system.

BRIEF DESCRIPTION

Embodiments disclosed herein include an inductor including at least one inductor coil, the at least one inductor coil including a plurality of outer longitudinal portions aligned around an outer periphery of the inductor, and a plurality of inner longitudinal portions aligned around an interior of the inductor. The plurality of outer longitudinal portions and the plurality of inner longitudinal portions collectively form two width-wise sides of the inductor and two length-wise sides of the inductor. The two width-wise sides and the two lengthwise sides define a substantially rectangular prism shape. The two width-wise sides and the two lengthwise sides define a hollow inductor core.

Another embodiment disclosed herein includes a bobbin including two width-wise sides; two length-wise sides, the two width-wise sides and the two length-wise sides defining a substantially rectangular prism shape and a hollow interior; at least one integral cooling passage wrapping around the two width-wise sides and the two length-wise sides, the integral cooling passage including: a fluid inlet; and a fluid outlet, The integral cooling passage receives at least one fluid.

Another embodiment disclosed herein includes at least one inductor coil including: a plurality of outer longitudinal portions aligned around an outer periphery of the inductor; a plurality of inner longitudinal portions aligned around an interior of the inductor; and at least one integral cooling feature disposed within the outer periphery of the inductor. The plurality of outer longitudinal portions and the plurality of inner longitudinal portions collectively define a substantially rectangular prism shape.

DRAWINGS

These and other features, aspects, and advantages of the present invention will become better understood when the following detailed description is read with reference to the accompanying drawings in which like characters represent like parts throughout the drawings, wherein.

Unless otherwise indicated, the drawings provided herein are meant to illustrate features of embodiments. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

Figure 1:
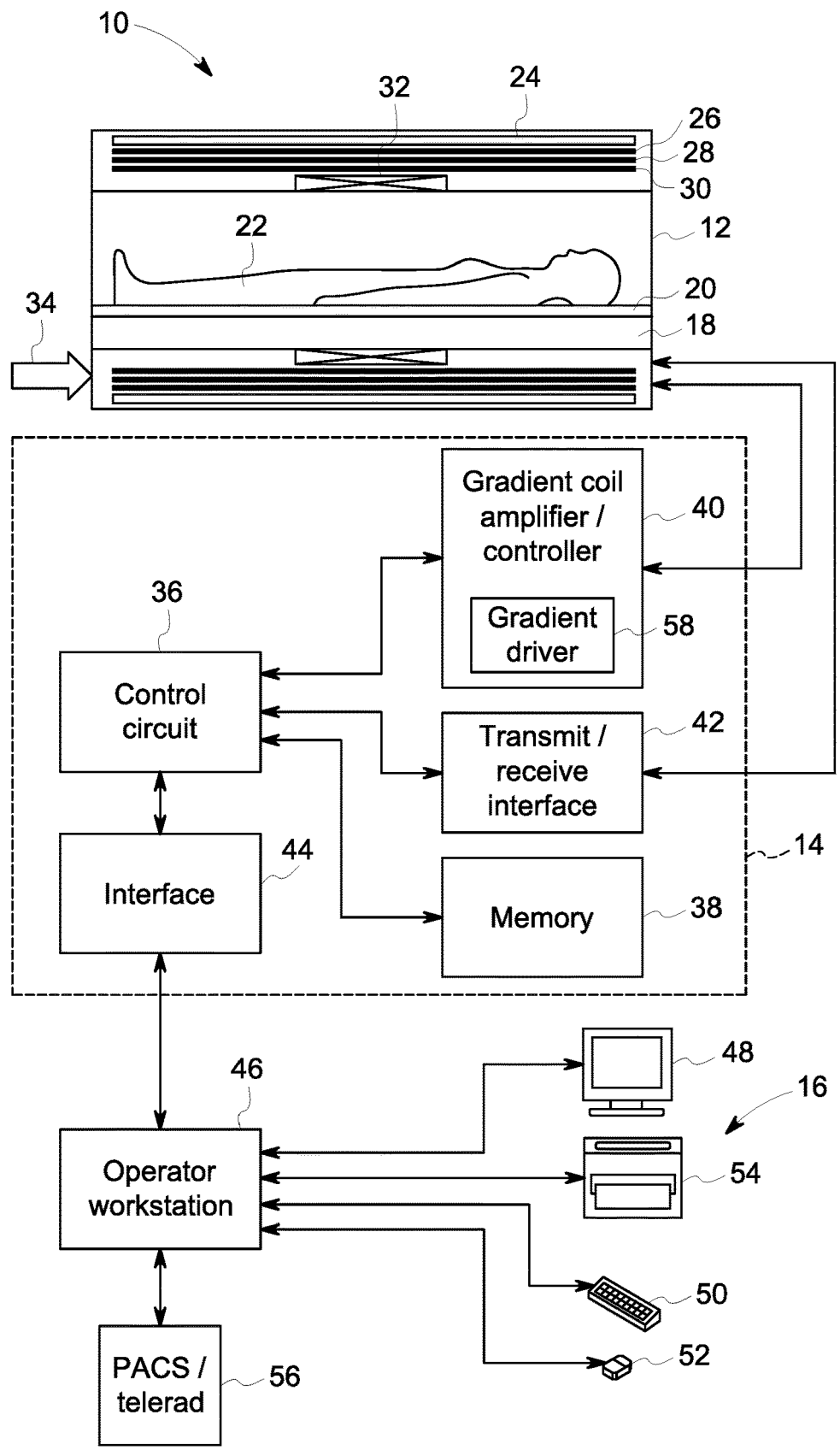
FIG. 1 is a diagrammatical representation illustrating an embodiment of an MRI system in accordance with an aspect of the present disclosure.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In an embodiment disclosed herein, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The coils 26, 28, 30, and 32 of the scanner 12 may be controlled by external circuitry to generate desired pulsed fields, and to induce signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

The interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The amplification and control circuitry 40 may also include a gradient driver 58 configured to deliver the drive current to the gradient field coils 26, 28, and 30. The gradient driver 58 may be implemented as a multi-level converter which may provide different voltages to several switching semiconductors electrically coupled in series. As used herein, the gradient driver 58 may also be referred to as a multi-level converter. In some embodiments, the gradient driver 58 may be configured to reduce electrical loss in the MRI system 10. For example, and as will be further discussed, the gradient driver 58 may be interleaved, and may include two or more multi-level converters to drive the gradient coils.

The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

The MRI system 10 may be configured to produce various types of images, including images on various patients and of different locations from patient bodies. Thus, depending on aspects of the MRI system 10, or on characteristics of an application of the MRI system 10, such as an image to be produced, a location on the patient to be imaged, a condition of the patient, etc., different gradient fluxes may be desired. The pulse sequence provided to the gradient coils 26, 28, and 30 should be sufficiently accurate and adjustable such that the coils 26, 28, and 30 may appropriately orient the selected slice and encode the frequency and phase to excite the desired material and acquire resulting signals for processing.

Thus, the quality and resolution of the image produced by the gradient flux may depend on the resolution of the pulse sequence delivered by the gradient driver 58 to the coils 26, 28, and 30. Due to the typical configurations and applications for current MRI systems, gradient coils may sometimes utilize pulse sequences having large amplitudes. Therefore, the ability to deliver a high fidelity and high-power pulse sequence may be considered in designing a gradient driver 58. As used herein, the pulse sequence may refer to an output of the gradient driver 58 and the current supplied to the coils 26, 28, and 30 for generating a gradient flux. The pulse sequence may be of variable length and may have any shape in waveform, which may depend on the system 10 or an application of the system 10.

Figure 2:
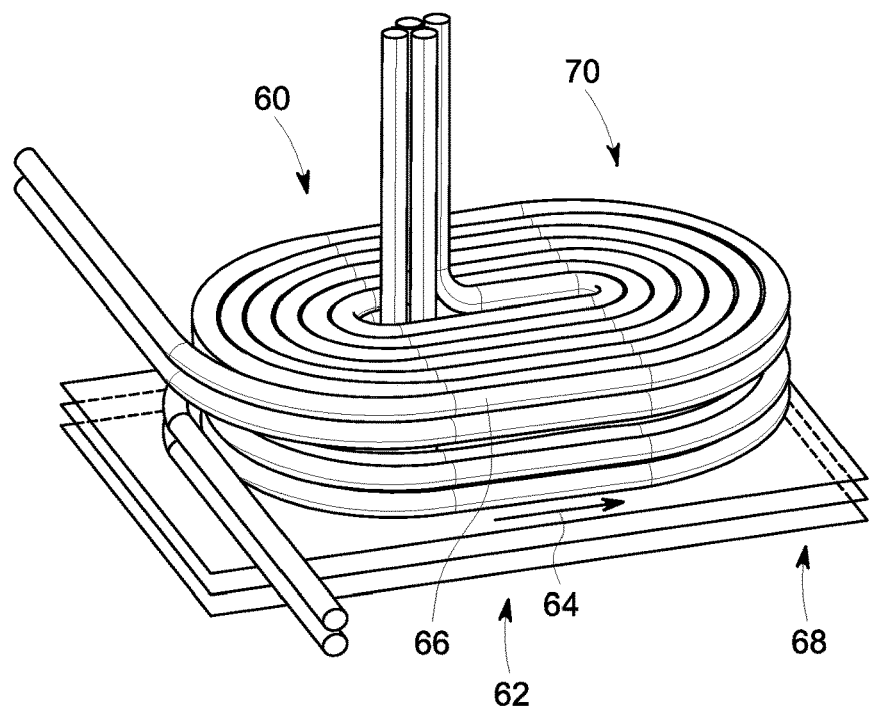
FIG. 2 illustrates an exemplary embodiment of an inductor in a spiral configuration.

FIG. 2 illustrates an exemplary embodiment of an inductor 60 in a spiral configuration. The spiral inductor 60, at a first portion 62 may include at least one winding 66 through which an electrical charge moves in a circumferential or tangential direction 64. A magnetic flux results, the magnetic flux being oriented in a radially outward direction 70 and an axial or longitudinal direction 68 (i.e., upwards in the embodiment of FIG. 2), depending on the orientation of the magnetic field (per the right-hand rule of electromagnetism). In either case, the resulting magnetic flux is not contained within the spiral structure and the presence of stray flux in the vicinity of the spiral inductor 60 is therefore likely.

Figure 3:
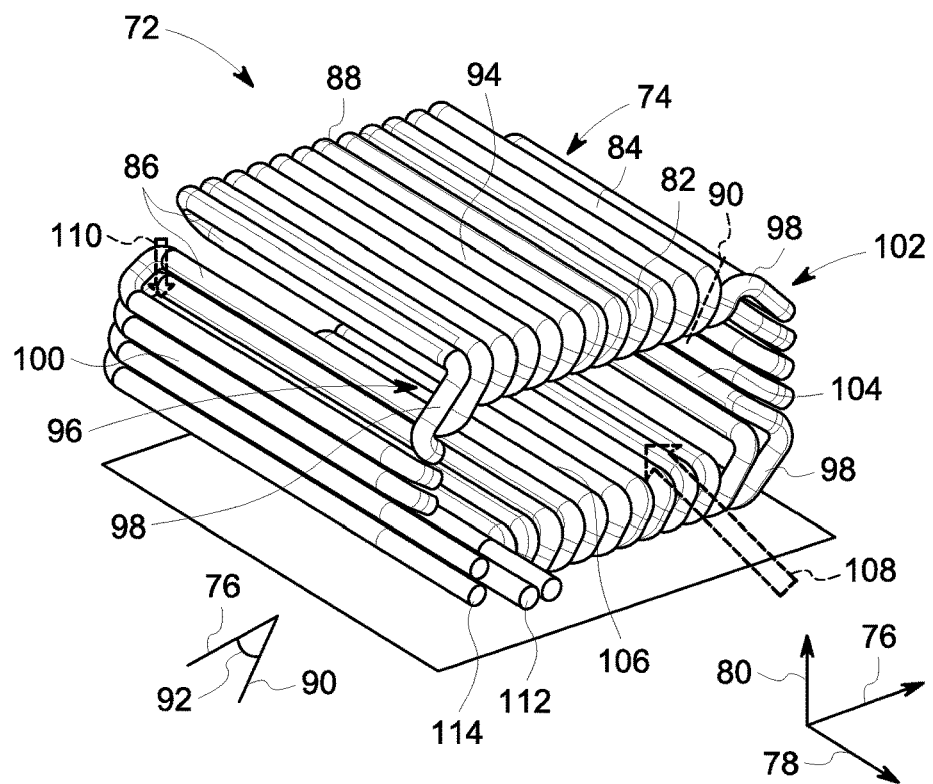
FIG. 3 illustrates an aircore inductor that may be used in a gradient driver system.

FIG. 3 illustrates an aircore inductor 72 that may be used in a gradient driver system, according to the embodiments disclosed herein. The aircore inductor 72 includes at least one inductor coil 74. The inductor coil 74 includes a plurality of outer longitudinal portions 84 extending in a longitudinal or z-direction 78 toward a plurality of first end portions 82. At each first end portion 82, the inductor coil 74 angles toward both a length-wise or y-direction 76 and a width-wise or x-direction 80. Each first end portion is oriented at a first angle 92 such that the orientation 90 of each first end portion forms an angle of about 45° with the length-wise direction 76. In other embodiments, the first angle 92 may be between about 40° and 50°. In other embodiments, the first angle 92 may be between about 35° and 55°. In other embodiments, the first angle 92 may be between about 30° and 60°. In other embodiments, the first angle 92 may be between about 15° and 75°.

Referring still to FIG. 3, each first end portion 82 connects to an inner longitudinal portion of a plurality of inner longitudinal portions 86. Each inner longitudinal portion 86 extends longitudinally toward a second end portion 88 disposed at a longitudinally opposite end of the aircore inductor 72 from the first end portion 82. Each second end portion 88 is angled in similar fashion to the orientation of each first end portion 82, noting that the angle of each second end portion is rotated in the x-y plane (i.e., the plane defined by directions 80 and 76) approximately 90° from the orientation of each first end portion. In other embodiments, the rotation of each second end portion 88 in the x-y plane may be from about 60° to about 120° relative to the orientation of each first end portion 82. At each second end portion 88, the inductor coil 74 transitions to one of the outer longitudinal portions 84. As such, the inductor coil 74 wraps or winds around forming a first length-wise side 94 of the aircore inductor 92.

Still referring to FIG. 3, at a first length-wise end 96 of the first end portion 82, the inductor coil 74 transitions to a first width-wise side 100 via at least one corner transition portion 98. The inductor coil 74 forms the first width-wise side 100 in a similar fashion to the first length-wise side 94, with the angling of each of the first and second end portions of the first width-wise side 100 also occurring in the x-y plane (i.e., the plane defined by directions 80 and 76). At a second length-wise end 102 of the first end portion 82, the inductor coil 74 transitions to a second width-wise side 104 via at least one corner transition portion 98. The second width-wise side 104 similarly transitions to a second length-wise side 106 via at least one corner transition portion 98. Each corner transition portion 98 may be angled at about 45° within the x-y plane relative to the x-direction 80 and/or the y-direction 76. In other embodiments, each corner transition portion 98 may be angled from about 30° to about 60° within the x-y plane relative to the x-direction 80 and/or the y-direction 76.

The first and second length-wise sides 94, 106 and the first and second width-wise sides 100, 104 collectively form the outer shape of the aircore inductor 72 as a three-dimensional orthotope, also known as a rectangular prism or a rectangular parallelepiped. The rectangular form factor of the aircore inductor 72 of FIG. 3 may be preferred compared to the spiral architecture of FIG. 2 since rectangular shapes may be easier to fit in spaces with other equipment then circular and/or cylindrical shapes. The aircore inductor 72, shaped as a three-dimensional orthotope, has a hollow core 108. Each of the first and second length-wise sides 94, 106 and the first and second width-wise sides 100, 104 include a plurality of inner longitudinal portions 86 and a plurality of outer longitudinal portions 82, which collectively define an open cavity 110 therebetween. The aircore inductor 72 also includes at least one inductor inlet 112 for receiving an external electrical charge, as well as at least one inductor outlet 114 for dispersing electrical charges after they have moved through the inductor coil 72.

The aircore inductor 72 may be formed from a single inductor coil 74 individually wrapping and/or winding around and forming each of the first and second length-wise sides 94, 106 and the first and second width-wise sides 100, 104, and defining a single electrical path from the inductor inlet 112 to the inductor outlet 114. In other embodiments, the aircore inductor 72 may be formed from two or more inductor coils 74 both wrapping around and forming each of the first and second length-wise sides 94, 106 and the first and second width-wise sides 100, 104, and defining multiple parallel electrical paths from the inductor inlet 112 to the inductor outlet 114. The inductor inlet 112 to the inductor outlet 114 may also be referred to as positive and negative leads 112, 114, respectively, and/or vice versa. In embodiments with two inductor coils 74 defining multiple parallel electrical paths, the two inductor coils 74 may alternate with each other as they wrap around and form each of the first and second length-wise sides 94, 106 and the first and second width-wise sides 100, 104. In other embodiments, the aircore inductor 72 may be formed from three, four, five, or a higher number of inductor coils 74.

The inductor coil(s) 74 may be made out of conductive materials such as copper, aluminum, and other suitable materials, and will have electrical properties such as low ohmic resistance.

Figure 4:
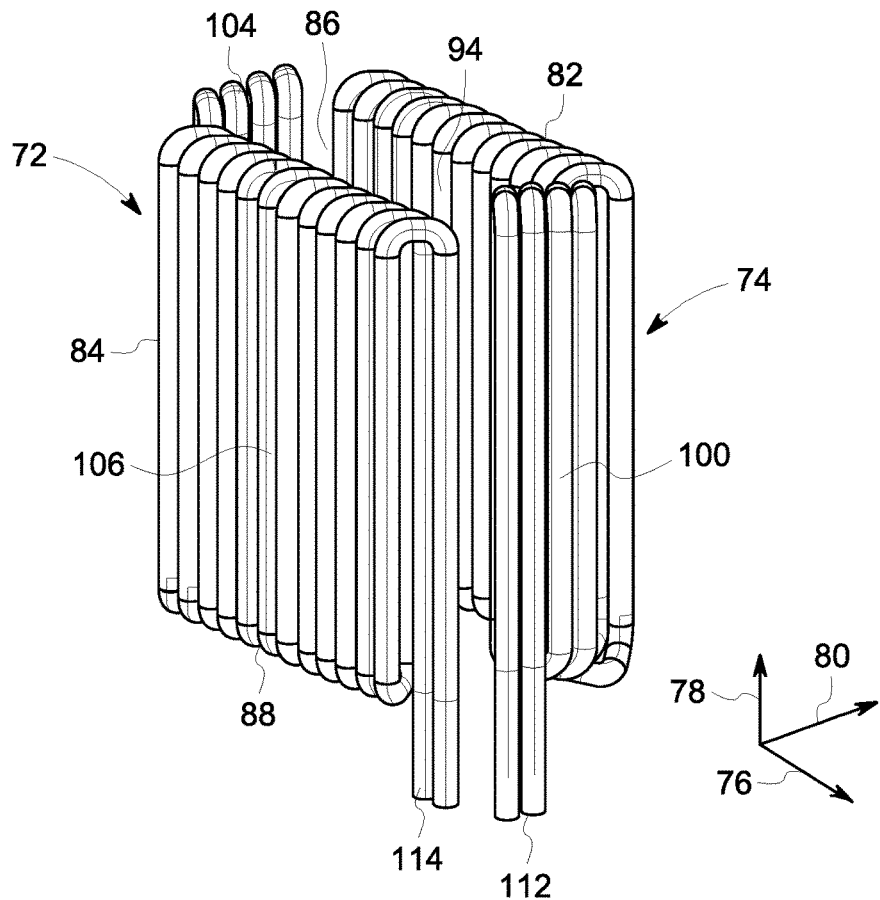
FIG. 4 illustrates a perspective view of an aircore inductor.

FIG. 4 illustrates a perspective view of an aircore inductor 72 according to the embodiments disclosed herein, in a different orientation to that of FIG. 3. The aircore inductor 72 includes first and second length-wise sides 94, 106, first and second width-wise sides 100, 104, a plurality of first longitudinal ends 82, a plurality of second longitudinal ends 88, an outer longitudinal portion 84, an inner longitudinal portion 86, an inductor inlet 112 and an inductor outlet 114. The inductor inlet 112 to the inductor outlet 114 may also be referred to as positive and negative leads 112, 114, respectively, and/or vice versa. For example, the inductor inlet 112 may be also be referred to as a first lead 112, while the inductor outlet 114 may also be referred to as a second lead 114, where either the first or second lead 112, 114 may be a positive lead or a negative lead. The one or more inductor coil 74 may make various numbers of passes on each of the first and second length-wise sides 94, 106, and the first and second width-wise sides 100, 104. For example, each of the first and second length-wise sides 94, 106, first and second width-wise sides 100, 104 may include between about 1 and about 30 individual longitudinal portions 84, 86. In addition, the first and second length-wise sides 94, 106 may include more individual longitudinal portions 84, 86 than the first and second width-wise sides 100, 104. For example, in one embodiment, the first and second length-wise sides 94, 106 may each include between about 6 and about 30 individual longitudinal portions 84, 86 while the first and second width-wise sides 100, 104 may each include between about 1 and about 6 individual longitudinal portions 84, 86. In another embodiment, the first and second length-wise sides 94, 106 may each include between about 8 and about 20 individual longitudinal portions 84, 86 while the first and second width-wise sides 100, 104 may each include between about 2 and about 5 individual longitudinal portions 84, 86. In another embodiment, the first and second length-wise sides 94, 106 may each include between about 10 and about 16 individual longitudinal portions 84, 86 while the first and second width-wise sides 100, 104 may each include between about 3 and about 5 individual longitudinal portions 84, 86.

In another embodiment, the first and second length-wise sides 94, 106 may each include 12 individual longitudinal portions 84, 86 while the first and second width-wise sides 100, 104 may each include 4 individual longitudinal portions 84, 86.

Figure 5:
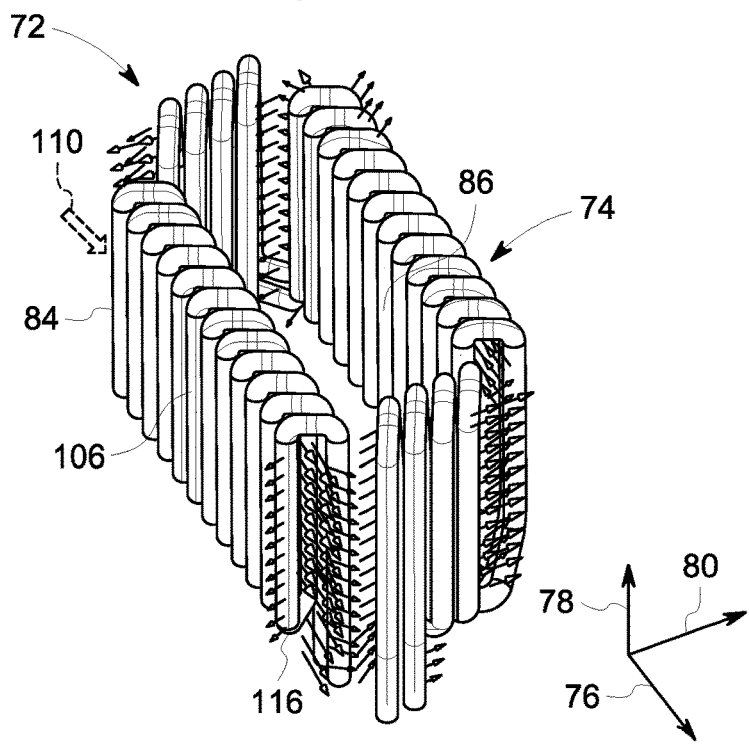
FIG. 5 illustrates a perspective view of an aircore inductor.

FIG. 5 illustrates a perspective view of an aircore inductor 72 according to the embodiments disclosed herein, including a plurality of magnetic field vectors 116. In operation, electrical charge travels through an outer longitudinal portion 84 of the second length-wise side 106 (as well as the other portions) in a longitudinal direction 78. Magnetic field vectors 116 are oriented in a length-wise or y-direction 76. Per the right-hand rule of electromagnetism, the magnetic flux resulting from charge movement through the outer longitudinal portion 84 is then oriented in the width-wise or x-direction 80. The magnetic flux resulting from charge movement through the outer longitudinal portion 84 is directed inward through the cavity 110 to the inner longitudinal portion 86 of the second length-wise side 106. Similarly, electrical charge travels through an inner longitudinal portion 84 of the second length-wise side 106 in a negative longitudinal direction 78 (i.e., downwards) and the resulting magnetic flux is directed outward through the cavity 110 and into the outer longitudinal portion 84 of the second length-wise side 106. In both cases (i.e., charge moving through either the outer longitudinal portion 84 and through the inner longitudinal portion 86) the resulting magnetic flux is not likely to stray beyond the boundary of the opposing longitudinal portion 84, 86. Therefore, due to the geometry of the inductor coil 74, the magnetic flux is largely confined within the structure of the aircore inductor 72. Analysis suggests that the stray flux of the aircore inductor 72 of FIGS. 3-8, 10, etc. may be an order of magnitude lower than the stray flux associated with the spiral configuration of FIG. 2.

Figure 6:
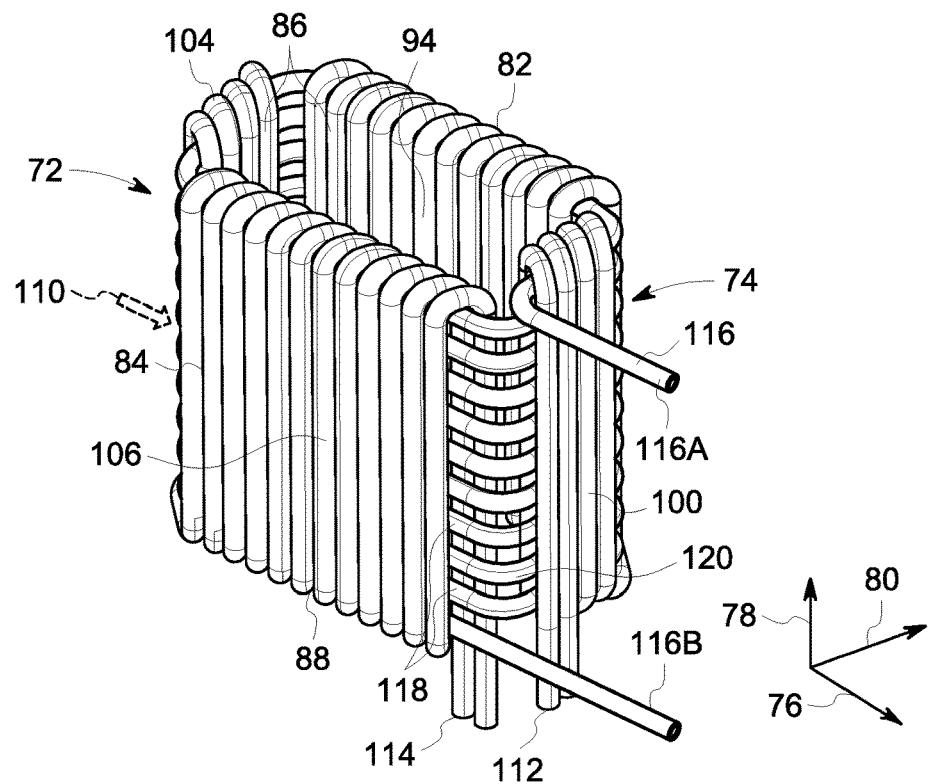
FIG. 6 illustrates a perspective view of an aircore inductor including integral cooling.

FIG. 6 illustrates a perspective view of an aircore inductor 72 according to the embodiments disclosed herein, including at least one integral cooling passage 116. The aircore inductor 72 includes first and second length-wise sides 94, 106, first and second width-wise sides 100, 104, a plurality of first longitudinal ends 82, a plurality of second longitudinal ends 88, an outer longitudinal portion 84, an inner longitudinal portion 86, an inductor inlet 112, and an inductor outlet 114. The embodiment of FIG. 6 includes an integral cooling passage 116 which may wrap around each of the inner longitudinal portions 86, and within each of the outer longitudinal portions 84. The integral cooling passage 116 occupies the open cavity 110 between the inner longitudinal portions 86 and the outer longitudinal portions 84, and wraps around and/or within each of the first and second length-wise sides 94, 106, and the first and second width-wise sides 100, 104.

Referring still to FIG. 6, the integral cooling passage 116 may be a single continuous cooling passage extending from a first passage end 116A to a second passage end 116B. The first passage end 116A and the second passage end 116B may extend away from the inductor coil 74 in a substantially parallel fashion (for example, with both the first passage end 116A and the second passage end 116B parallel to the length-wise direction 76). In other embodiments, the first passage end 116A and the second passage end 116B may extend away from the inductor coil 74 in different directions. The at least one integral cooling passage may also include multiple cooling passages arranged in a parallel configuration and alternating along a longitudinal direction 78 of the aircore inductor 72. The integral cooling passage 116 may have cooling fluid disposed within it so as to aid in regulating the thermal loads generated by the inductor coil 74. The cooling fluid may include air, liquid water, deionized water, oil, ammonia, and other suitable fluids. Each of the first and second passage ends 116A, 166B may serve as either a fluid inlet or a fluid outlet. Because the integral cooling passage 116 is both inward of and adjacent to each of the outer longitudinal portions 84 as well as outward of and adjacent to each of the inner longitudinal portions 86, the integral cooling passage may serve to thermally regulate both the inner and out longitudinal portions 84, 86. In addition, because the integral cooling passage 116 is inward of the outer longitudinal portions 84, the integral cooling passage 116 does not increase the overall size of the aircore inductor 72, nor does it significantly impact the overall rectangular form factor of the aircore inductor 72.

Still referring to FIG. 6, the integral cooling passage(s) 116 may make various numbers of passes 118 around and/or through the aircore inductor 72 between the first passage end 116A and the second passage end 116B. For example, the integral cooling passage(s) 116 may include between about 1 and about 20 passes 118. In other embodiments, the integral cooling passage(s) 116 may include between about 2 and about 16 passes 118. In other embodiments, the integral cooling passage(s) 116 may include between about 4 and about 12 passes 118. In other embodiments, the integral cooling passage(s) 116 may include between about 6 and about 10 passes 118. Each pass 118 of the integral cooling passage 116 around the aircore inductor 72 may include a 90° bend 120 at the transitions between each of the first and second length-wise sides 94, 106, and the first and second width-wise sides 100, 104. As such, pass 118 of the integral cooling passage 116 around the aircore inductor 72 may include four 90° bends 120, and may be substantially rectangular. In addition, each pass 118 of the integral cooling passage 116 may be serially and/or fluidly connected to a previous or subsequent pass 118. Each pass 118 may be serially and/or fluidly connected to an adjacent pass 118 in embodiments which include a single continuous integral cooling passage 116. In embodiments with more than one integral cooling passages 116, each pass 118 may be serially and/or fluidly connected to a pass 118 that is not adjacent to it (for example, in an embodiment which includes two integral cooling passages 116 that alternate with each other as they wrap around and through the inductor coil 74).

Figure 7:
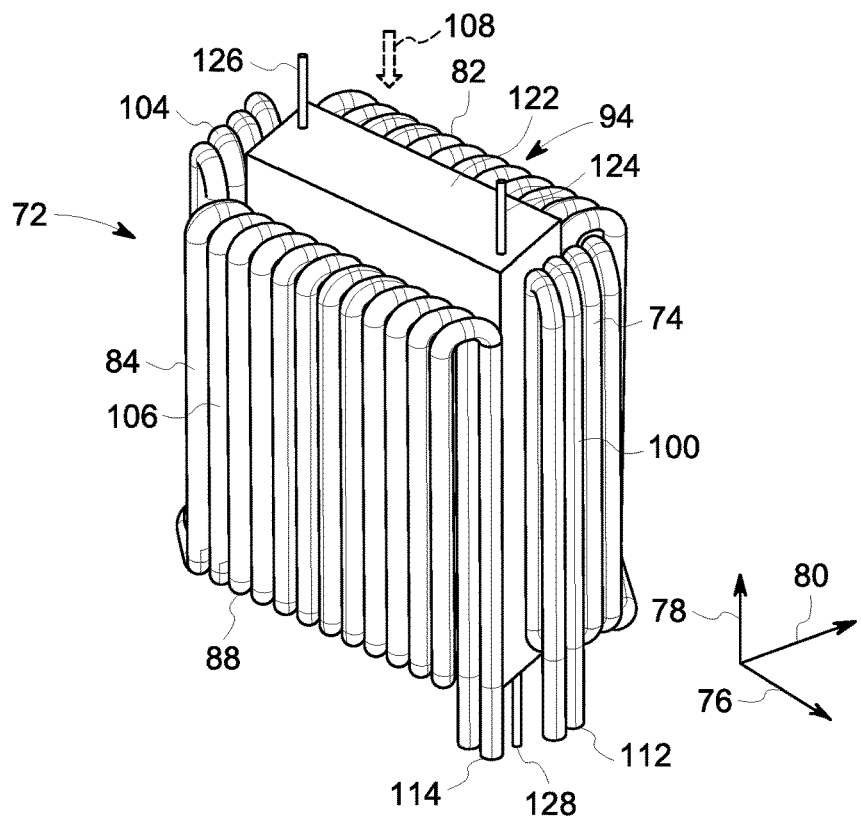
FIG. 7 illustrates a perspective view of an aircore inductor including a cold plate.

FIG. 7 illustrates an embodiment of the aircore inductor 72 including an integral cold plate 122. The aircore inductor 72 includes first and second length-wise sides 94, 106, first and second width-wise sides 100, 104, a plurality of first longitudinal ends 82, a plurality of second longitudinal ends 88, an outer longitudinal portion 84, an inner longitudinal portion (not shown), an inductor inlet 112, and an inductor outlet 114. The integral cold plate 122 occupies the hollow core 108 of the aircore inductor 72. The integral cold plate 122, similar to the integral cooling passage 116 of FIG. 6, may aid in regulating the thermal loads of the aircore inductor 72 due to heat generated from electrical charge moving through the inductor coil 74. The integral cold plate 122 may include one or more internal cooling passages for circulating cooling fluid to regulate a temperature of at least one surface of the internal cold plate 122, which may be absorbing heat from the inductor coil 74. The integral cold plate 122 may include a fluid inlet 124 which is fluidly connected to the one or more internal cooling passages (not shown) within the integral cold plate 122, for introducing a cooling fluid to the interior of the integral cold plate 122. The integral cold plate 122 may also include a fluid outlet 126 which is fluidly connected to the one or more internal cooling passages (not shown) within the integral cold plate 122. Both the fluid inlet 124 and the fluid outlet 126 may be disposed on the same longitudinal end of the integral cold plate 122. Alternatively, a second and/or alternate fluid outlet 128 may be disposed at the opposing longitudinal end of the integral cold plate 122 to that of the fluid inlet 124.

Figure 8:
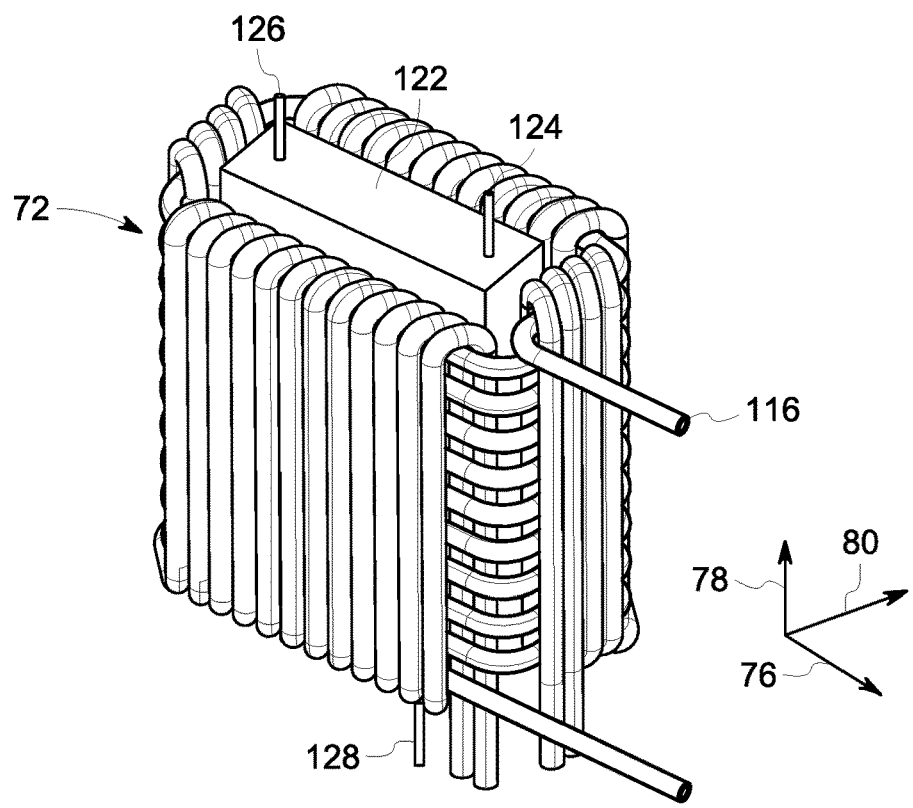
FIG. 8 illustrates a perspective view of an aircore inductor including integral cooling and a cold plate.

FIG. 8 illustrates an embodiment of the aircore inductor 72 including an integral cold plate 122 similar to that of FIG. 7, and an integral cooling passage 116, similar to that of FIG. 6. In the embodiment of FIG. 8, the integral cooling passage 116 and the integral cold plate 122 may both act to cool and/or mitigate the thermal loads of the aircore inductor 72.

Figure 9:
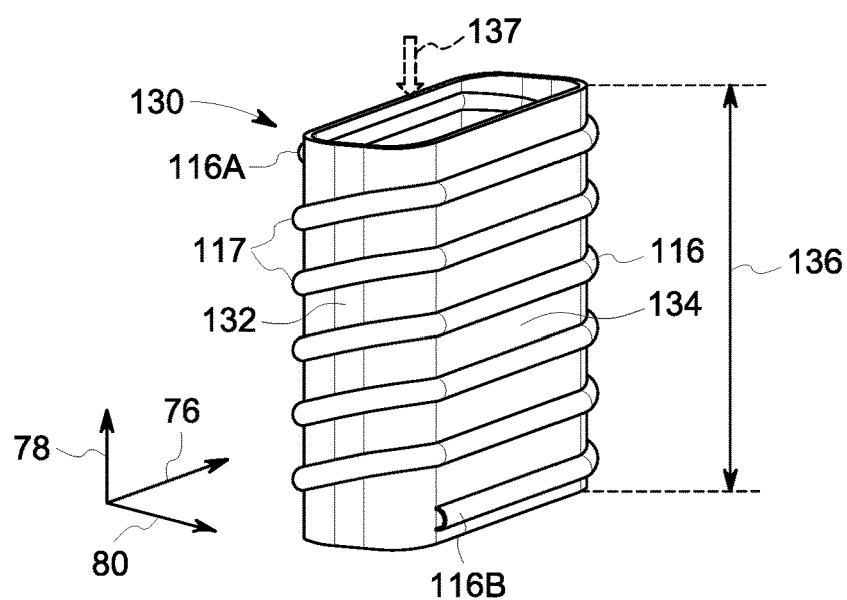
FIG. 9 illustrates a perspective view of a bobbin used for an aircore inductor.

FIG. 9 illustrates a bobbin 130, around which the inductor coil 74 (not shown) may be wrapped or wound. The bobbin 130 may include the integral cooling passage 116 through which a cooling fluid may flow for thermally managing heat loads from the inductor coil 74 (not shown) when in use. The integral cooling passage may include a first passage end 116A and a second passage end 116B, either of which may serve as a fluid inlet and/or fluid outlet to the integral cooling passage 116. The integral cooling passage 116 may include multiple passage passes 117 as the integral cooling passage 116 winds around the periphery of the bobbin 130 from the first passage end 116A to the second passage end 116B. The bobbin 130 may include a width-wise side wall 132 and a length-wise side wall 134, both of which structurally connect adjacent passes 117 of the integral cooling passage 116 and which occupy the space between adjacent passes 117 of the integral cooling passage 116. The dimensions of the bobbin 130 may match or approximately match the dimensions of the aircore inductor 72 (not shown) and/or inductor coil 74 (not shown) such that the length of the longitudinal portions 84, 86 approximately match the longitudinal length 136 of the bobbin 130 (and similarly for the length-wise and width-wise dimensions of the bobbin 130 and corresponding dimensions of the aircore inductor 72 (not shown)). The bobbin 130 also includes a hollow interior 137 which may be partially occupied by the inner longitudinal portions 86 in operation within an aircore inductor 72.

Figure 10:
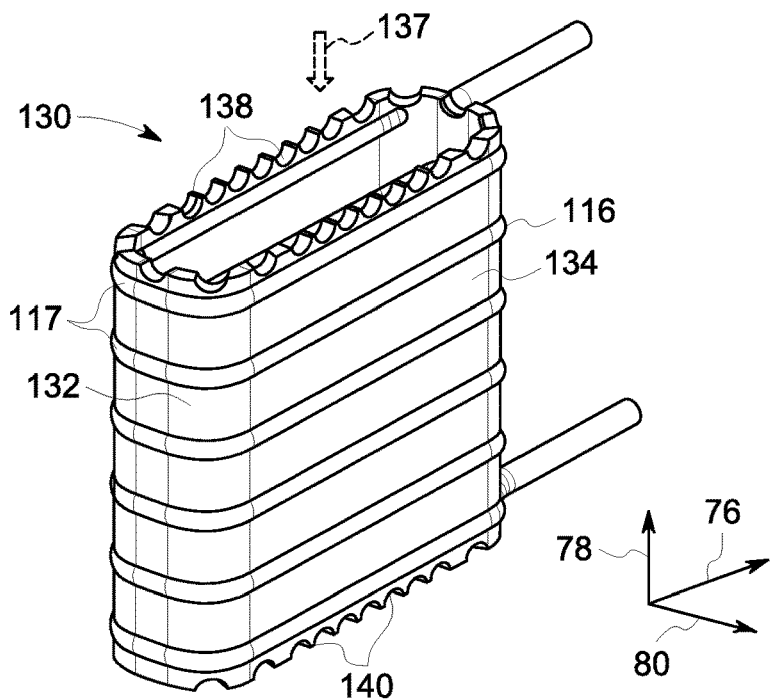
FIG. 10 illustrates a perspective view of a bobbin.

FIG. 10 illustrates a bobbin 130, around which the inductor coil 74 (not shown) may be wrapped or wound. In the embodiment of FIG. 10, the bobbin 130 includes a first plurality of grooves 138 at one longitudinal end of the bobbin 130 and a second plurality of grooves 140 at the other longitudinal end of the bobbin 130. The first and second plurality of grooves 138, 140 may be semi-circular in shape for receiving each of the first and second longitudinal ends 82, 88 of the inductor coil 74. In the embodiment of FIG. 10, the first and second passage ends 116A, 116B are disposed at opposite longitudinal ends of the bobbin 130. In other embodiments, the first and second passage ends 116A, 116B may be disposed at the same longitudinal end of the bobbin 130.

Figure 11:
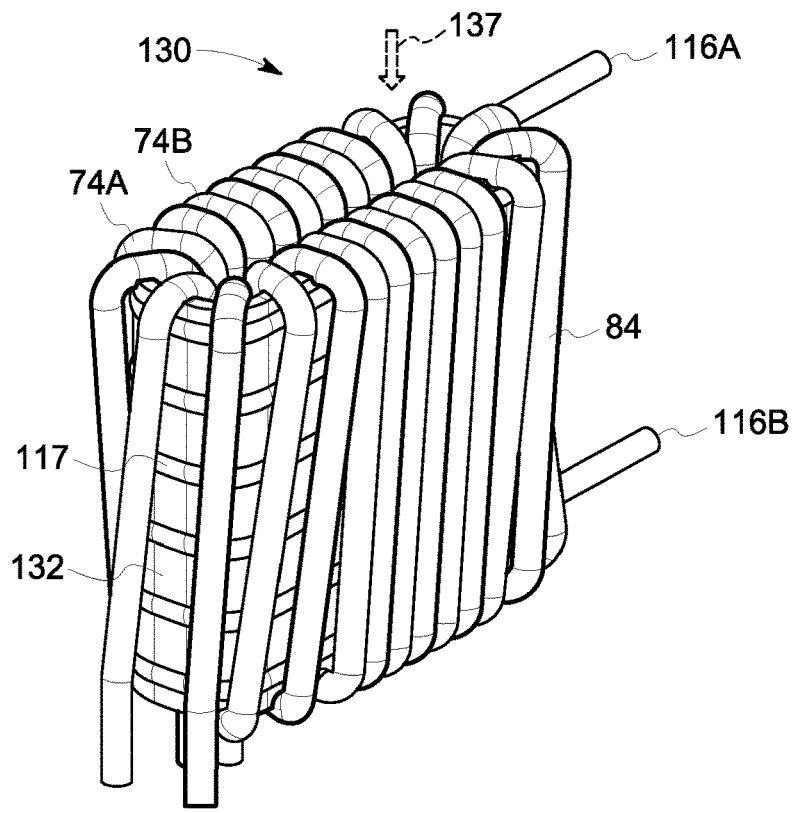
FIG. 11 illustrates a perspective view of a bobbin.

FIG. 11 illustrates a bobbin 130, around which a first inductor coil 74A and a second inductor coil 74B are wound. Each outer longitudinal portion 84 of the first and second inductor coils 74A, 74B is disposed around the outside of the bobbin 130, while each inner longitudinal portion 86 (not shown) is disposed within the hollow interior 137 of the bobbin 130. Brackets (not shown) as well as other mounting and/or connecting hardware may also be used to structurally secure the first and second inductor coils 74A, 74B to the bobbin 130. In each of the embodiments of FIGS. 9-11, as well as other figures, the integral cooling passage 116 (which may have a circular, elliptical, triangular, rectangular, hexagonal, square, or other cross-sectional shape) may extend beyond the surfaces of each of the width-wise side wall 132 and the length-wise side wall 134.

Figure 12:
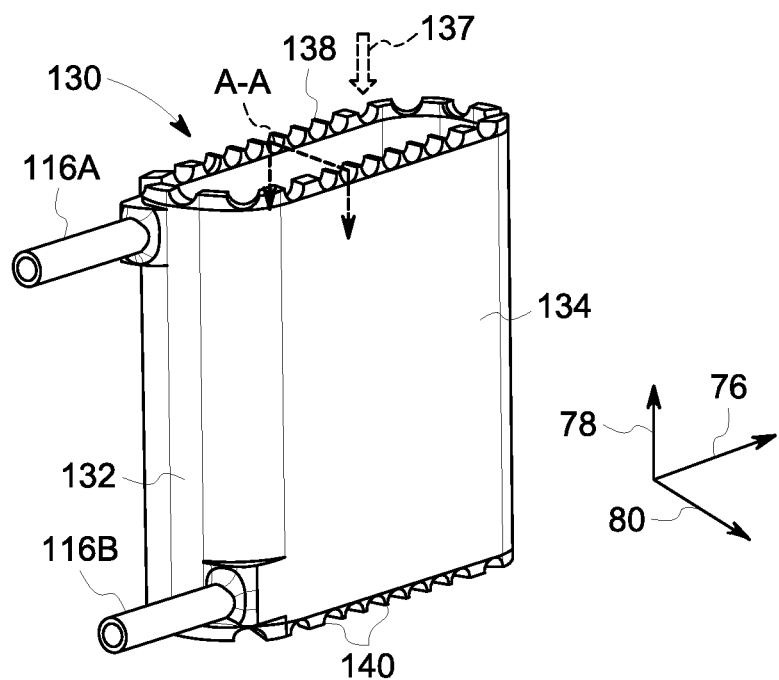
FIG. 12 illustrates a perspective view of a bobbin.

FIG. 12 illustrates a bobbin 130, around which the inductor coil 74 (not shown) may be wrapped or wound. In the embodiment of FIG. 12, the bobbin 130 includes at least one integral flow passage 116 (not shown) that is confined within each of width-wise side wall 132 and the length-wise side wall 134. Stated otherwise, the at least one integral cooling passage 116 is internal to each of the sidewalls 132, 134 of the bobbin. In the embodiment of FIG. 12, the sidewalls 132, 134, the first plurality of grooves 138, the second plurality of grooves 140, the at least one integral cooling passage 116, as well as the first and second passage ends 116A, 116B may all be formed integrally and concurrently using a process such as additive manufacturing such that the bobbin is formed as a single, continuous, monolithic structure.

Figure 13:
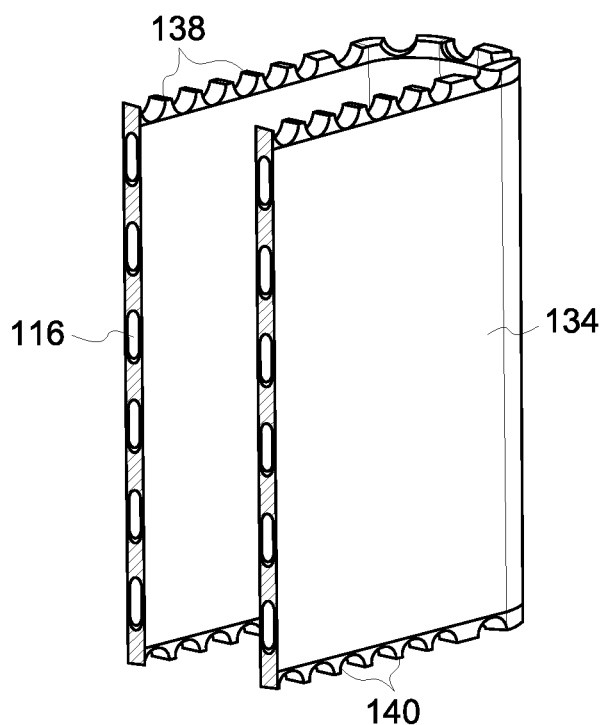
FIG. 13 illustrates a perspective view of a portion of a bobbin.

FIG. 13 is a perspective view of a cutaway portion of bobbin 130 along line A-A in FIG. 12 illustrating the integral cooling passage 116. The cross section of integral cooling passage 116 may be elongated in a longitudinal direction 78. In addition, the integral cooling passage 116 may be contoured and/or curved along each longitudinal end. In other embodiments, the integral cooling passage may include other cross-sectional shapes including but not limited to circular, elliptical, triangular, rectangular, hexagonal, and square.

Figure 14:
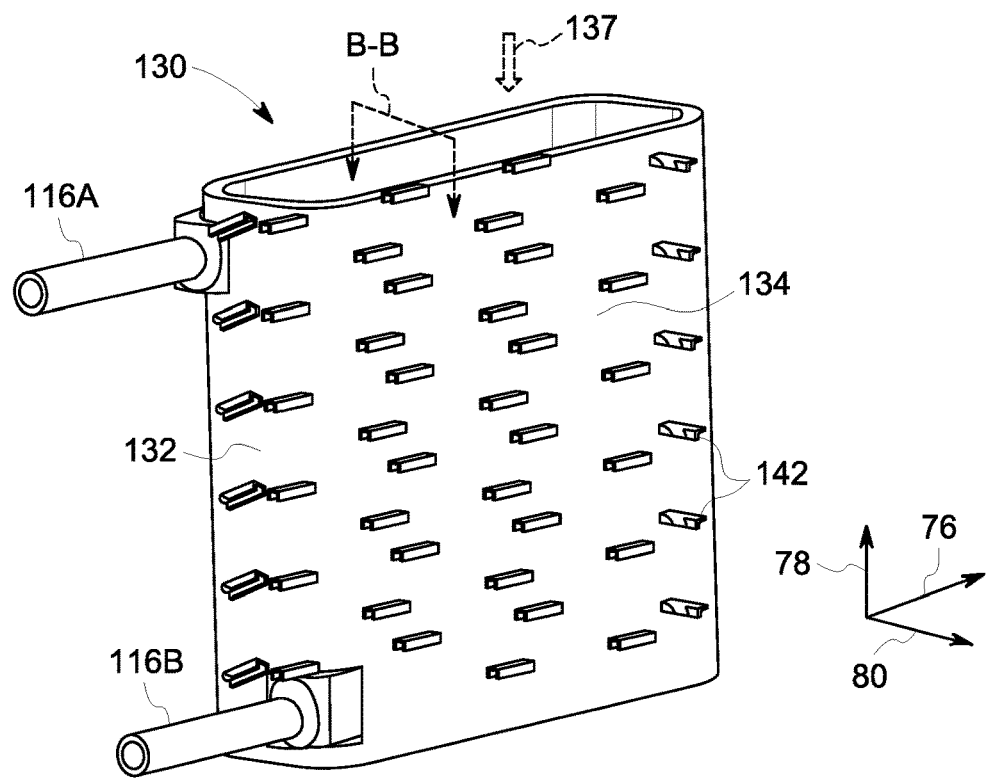
FIG. 14 illustrates a perspective view of a bobbin.

FIG. 14 illustrates a bobbin 130, around which the inductor coil 74 (not shown) may be wrapped or wound. In the embodiment of FIG. 14, the bobbin 130 includes at least one integral cooling passage 116 (not shown) with at least one passage support 142. The at least one passage support 142 may be disposed at various longitudinal, width-wise, and length-wise spatial intervals within the at least one integral cooling passage 116. The at least one passage support 142 may serve at least two purposes. Firstly, the at least one passage support 142 serves to structurally reinforce the bobbin 130 in the vicinities of the at least one integral cooling passage 116 where less material is present. Secondly, the at least one passage support 142 may serve to enhance heat transfer by acting as a turbulator and/or convective heat transfer enhancement feature, thereby directing and/or accelerating the flow of cooling fluid onto various surfaces internal to the integral cooling passage 116. The at least on passage support 142 may be fin-shaped, helically-shaped (for example, formed as a coil or spring), rib-shaped, vane-shaped, as well as other suitable shapes.

Figure 15:
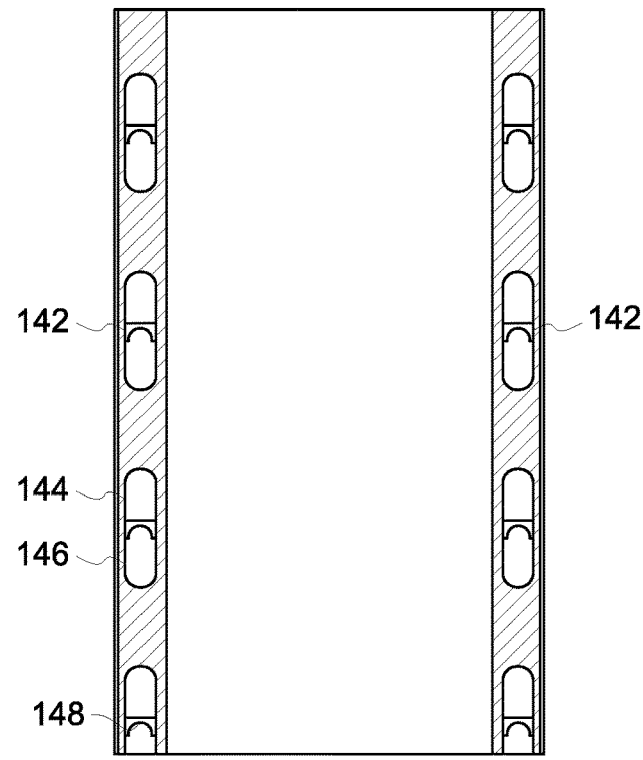
FIG. 15 illustrates a perspective view of a portion of a bobbin.

FIG. 15 is a perspective view of a cutaway portion of bobbin 130 along line B-B in FIG. 14 illustrating the integral cooling passage 116 with passage supports 142. The at least one passage support 142 may divide the at least one integral cooling passage 116 into two portions, an upper portion 144 and a lower portion 146. The upper portion 144 may be at one longitudinal end of the integral cooling passage 116 while the lower portion 146 may be disposed at an opposing longitudinal end of the integral cooling passage 116. The at least one passage support 142 may include a semi-circular portion 148, the semi-circular portion 148 being open toward the lower portion 146. In other embodiments, the at least one passage support 142 may include a semi-circular portion 148 that is open toward the upper portion 144. In other embodiments, the at least one passage support 142 may include more than one semi-circular portions 148, a first one that is open toward the upper portion 144, and a second that is open toward the lower portion 146. The at least one passage support 142 may be formed integrally, for example via additive manufacturing, via one or more concurrent build processes used to form the other portions of the bobbin 130.

Figure 16:
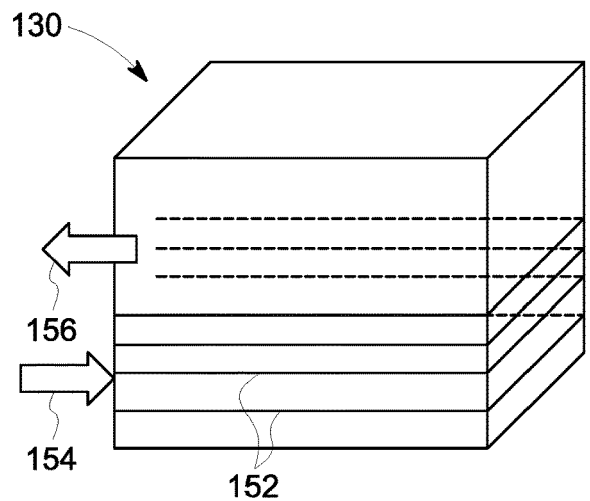
FIG. 16 illustrates a schematic view of a bobbin internal flow arrangement.

FIG. 16 is a schematic representation of a flow arrangement within a bobbin 130, according to aspects of the embodiments disclosed herein. In the embodiment of FIG. 16, a plurality of parallel flow passages 152 are fluidly coupled to a flow inlet 154 and extend around the bobbin before exiting at a flow outlet 156.

Figure 17:
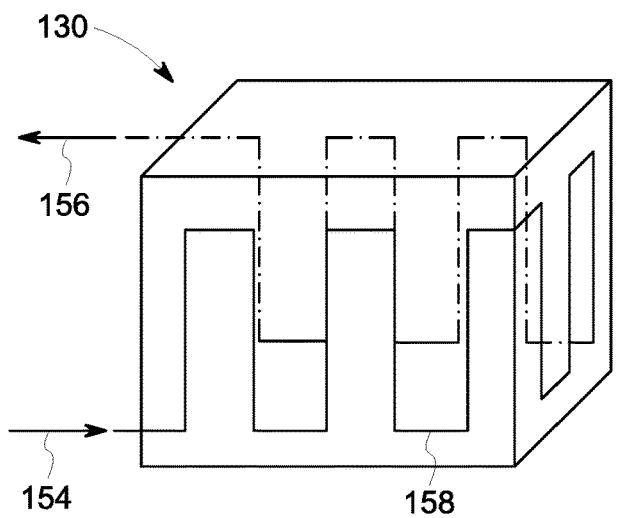
FIG. 17 illustrates a schematic view of a bobbin internal flow arrangement.

FIG. 17 is a schematic representation of a flow arrangement within a bobbin 130, according to aspects of the embodiments disclosed herein. In the embodiment of FIG. 17, a single flow passage 158 is fluidly coupled to a flow inlet 154 and extends longitudinally and either length-wise or width-wise within each plane defined by the walls of the bobbin 130, before exiting at a flow outlet 156.

Figure 18:
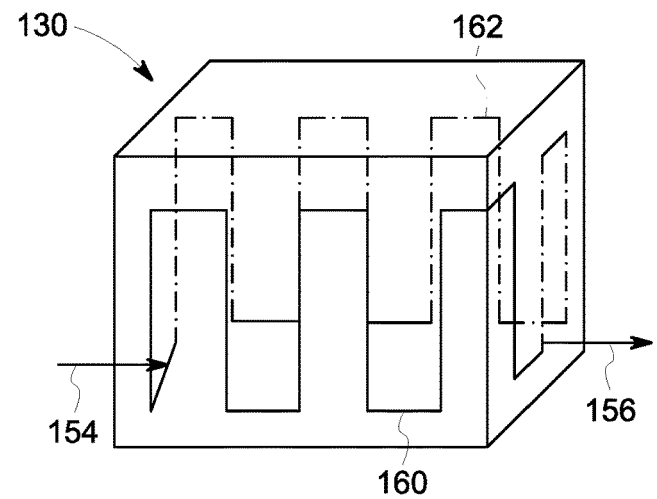
FIG. 18 illustrates a schematic view of a bobbin internal flow arrangement.

FIG. 18 is a schematic representation of a flow arrangement within a bobbin 130, according to aspects of the embodiments disclosed herein. In the embodiment of FIG. 18, a first flow passages 160 is fluidly coupled to a flow inlet 154 and extends longitudinally and either length-wise or width-wise within each plane defined by the walls on one or more sides of the bobbin 130, before exiting at a flow outlet 156. The bobbin 130 illustrated in FIG. 18 also includes a second flow passages 162 that is fluidly coupled to the flow inlet 154 and extends longitudinally and either length-wise or width-wise within each plane defined by the walls on one or more sides of the bobbin 130, before exiting at the flow outlet 156. Each of the bobbins 130 and flow schematics thereof illustrated in FIGS. 9-18 may be used in connection with the inductor coil 74 and/or aircore inductors 72 illustrated in FIGS. 3-8. For example, the bobbin 130 and integral cooling passage 116 of FIGS. 9-18 may be used within the aircore inductors 72 and/or in place of the integral cooling passage 116 of FIGS. 3-8. The bobbin 130, which may be formed via additive manufacturing as well as other processes, may also be coated with a fine layer of epoxy to seal any surface pores (not shown), if required. The bobbin 130 may also be plated with metals in order to provide increased stiffness and mechanical support.

Figure 19:
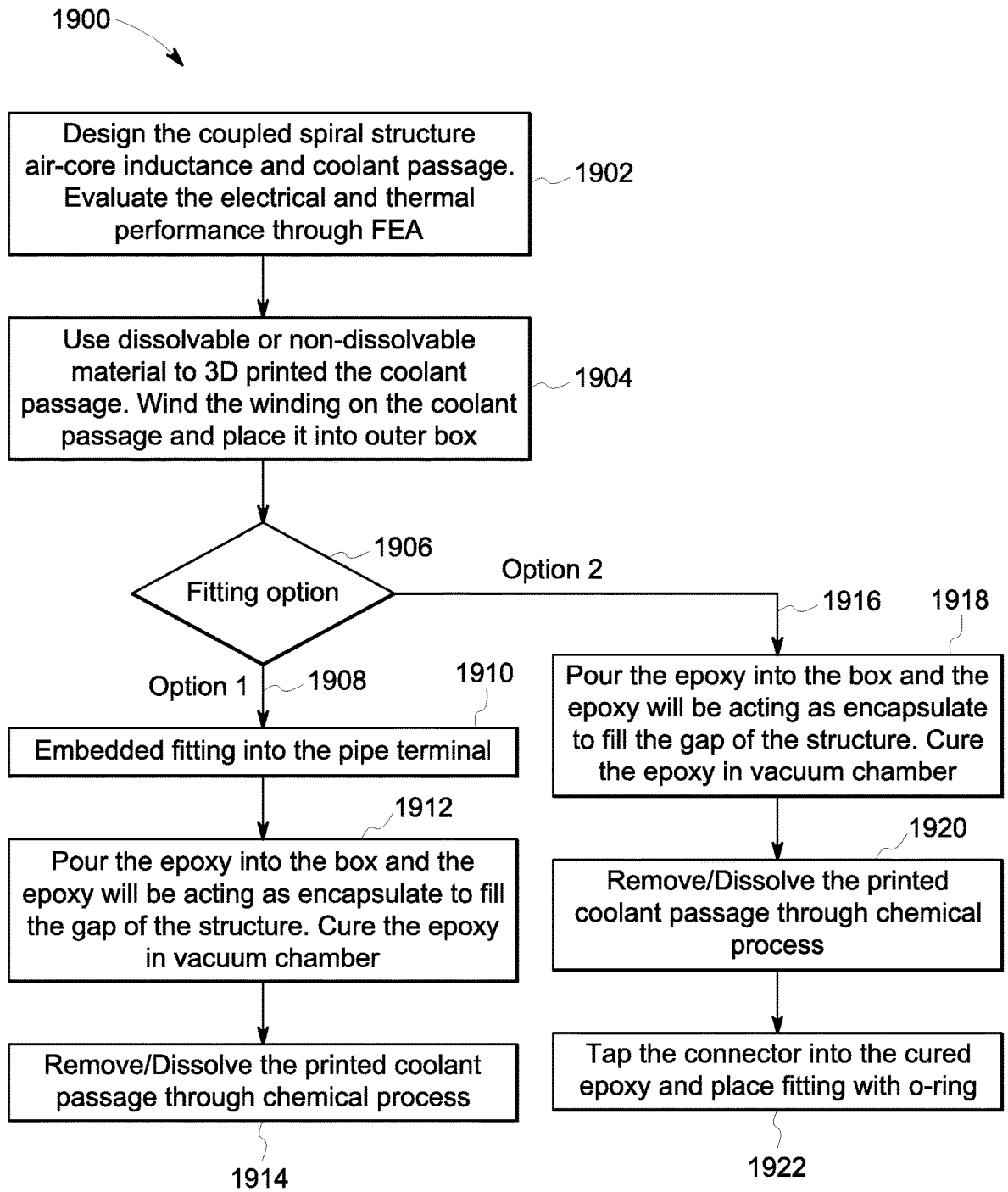
FIG. 19 illustrates a method of forming an aircore inductor.

FIG. 19 illustrates a method 1900 of forming the bobbin 130 of FIGS. 9-11. At step 1902, the method 1900 includes, designing a coupled spiral structure for the bobbin 130 and integral cooling passage 116 and evaluating the electrical and thermal performance through finite element analysis and/or other analysis methods. At step 1904, the method 1900 includes using dissolvable or non-dissolvable material to 3D-print the integral cooling passage 116 and wind the bobbin sidewalls 132, 134 onto the integral cooling passage 116. If dissolvable material is used at step 1904, the material will be removed either at step 1914 or step 1920. Alternatively, non-dissolvable material may be used in embodiments where the bobbin 130 is formed from a monolithic material. If a non-dissolvable material may used at step 1904, it is not removed in subsequent steps. At step 1904, the method 1900 also includes placing the wound integral cooling passage 116 and the bobbin sidewalls 132, 134 into a box, shell, or frame. At step 1906, the method 1900 includes selecting a first option 1908 or a second option 1916. At step 1910, the first option 1908 of method 1900 includes embedding a fitting into a pipe terminal of the integral cooling passage 116/bobbin sidewalls 132, 134 assembly. At step 1912, the method 1900 includes pouring epoxy into the box to encapsulate the integral cooling passage 116/bobbin sidewalls 132, 134 assembly and fill gaps therebetween. At step 1912, the method 1900 also includes curing the epoxy in a vacuum chamber. At step 1914, the method 1900 includes removing and/or dissolving the printed cooling passage through a chemical process. Referring to the second option 1916, the method includes performing step 1918 (same as step 1912) followed by step 1920 (same as step 1914). At step 1922, the second option 1916 of method 1900 includes tapping the connector into the cured epoxy and placing the fitting with an O-ring. Method 1900 may also include other steps and sub-steps. In some embodiments, not all steps of method 1900 will be performed. In addition, some steps may be performed in a different order than what is shown in FIG. 19.

Figure 20:
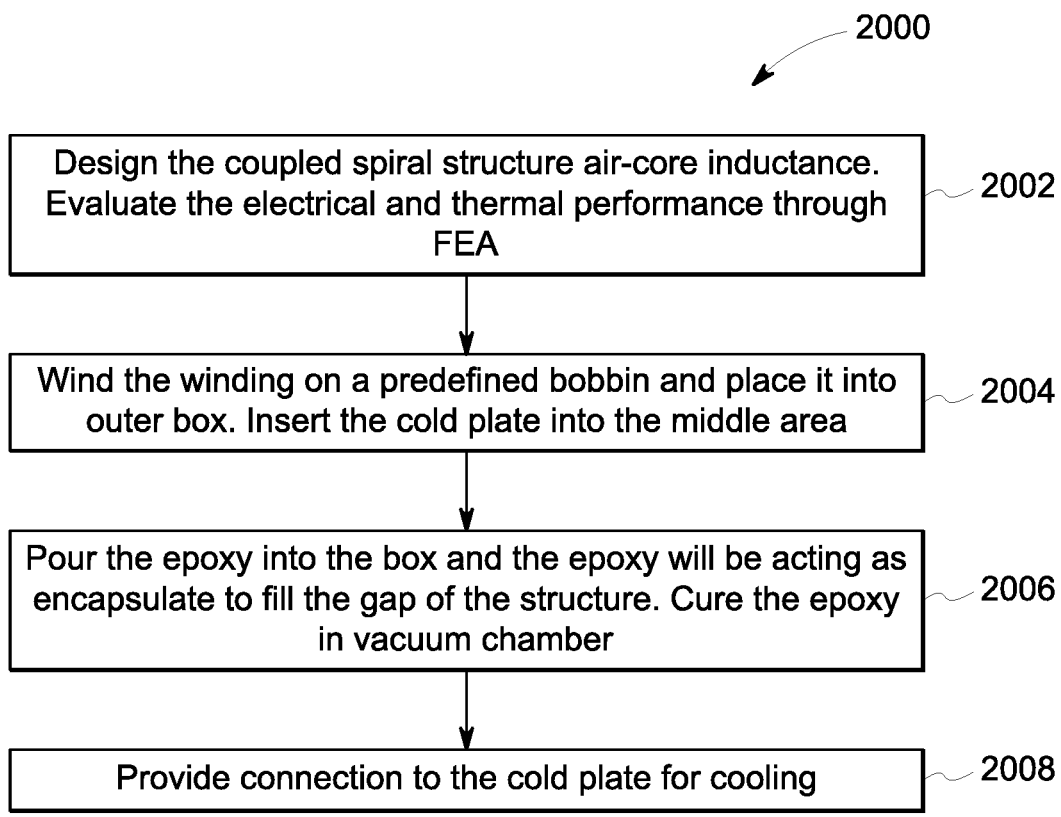
FIG. 20 illustrates a method of forming an aircore inductor, in accordance with aspects of the embodiments disclosed herein.

FIG. 20 illustrates a method 2000 of forming a bobbin 130 assembly of embodiments disclosed herein, the bobbin 130 assembly including a cold plate 122. At step 2002, the method 2000 includes, designing a couple spiral structure for the bobbin 130 and integral cooling passage 116 and evaluating the electrical and thermal performance through finite element analysis and/or other analysis methods. At step 2004, the method 2000 includes providing a bobbin 130 and winding the inductor coil 74 onto the bobbin 130. At step 2004 the method also includes placing the inductor coil 74 and bobbin 130 into a box or shell. At step 2004 the method also includes inserting the cold plate into a hollow core 108 of the bobbin 130/inductor coil 74 assembly. At step 2006, the method 2000 includes pouring epoxy into the box to encapsulate the integral cooling passage 116/bobbin sidewalls 132, 134 assembly and fill gaps therebetween. At step 2006, the method 2000 also includes curing the epoxy in a vacuum chamber. At step 2008, the method 2000 includes providing a connection to the cold plate 122 for cooling. The epoxy may be any epoxy that acts as an electrical insulator while simultaneously acting as a thermal conductor. For example, the epoxy may include ceramic material, ceramic filler, boron nitride, aluminum nitride, carbon nanotubes, and/or other suitable materials. The epoxy may include a filler such as a silicon resin allowing the epoxy to harden after curing. As such, composite epoxies may be desired. Method 2000 may also include other steps and sub-steps. In some embodiments, not all steps of method 2000 will be performed. In addition, some steps may be performed in a different order than what is shown in FIG. 20.

Each of the embodiments of the bobbin 130, integral cooling passage 116, cold plate 122, and/or other components and features disclosed herein that may be formed via additive manufacturing may be formed using any appropriate additive modality, based on the material (i.e., ceramic, polymer, metal, etc.), feature details, and other requirements. As used herein, the term "modality" refers to any additive manufacturing build methods and processing including but not limited to binder jetting, directed energy deposition, material extrusion, selective laser melting (SLM), material jetting, powder bed fusion, sheet lamination, welding, brazing, vat photopolymerization, stereolithography (SLA), direct metal laser melting (DMLM), fused deposition modeling (FDM), direct metal laser sintering (DMLS), and electron beam melting (EBM). There are also additive modalities that do not utilize powder. Additive manufacturing is also referred to as a generative build process.

The MRI system 10 according to the embodiments disclosed herein provide a gradient driver 58 capable of higher coupling coefficients, smaller size, better control of magnetic flux and better thermal performance. The high-density air-core inductor 72 operates without a magnetic core and can be utilized within a patient scan room and therefore enables the gradient driver 58 to be inside the scan room, reducing or eliminating the need for an equipment room at a hospital, and increasing flexibility of the locations within a hospital in which a scanner may be employed. Each of the cold plate 122, the integral cooling passage 116, and/or the bobbin 130 of the embodiments disclosed herein may be made of materials that act as electrical insulators as well as thermal conductors. This enables enhanced heat transfer between the cold plate 122 and/or the integral cooling passage 116 and the inductor coil 74, while minimizing electro-magnetic interference (EMI) with the aircore inductor and other electronic and/or electro-magnetic equipment in the vicinity. For example, insulating materials should be able to withstand a voltage potential of at least 2500V between a thermal conductor and any metal ground. Similarly, any material acting as a thermal insulator and/or conductor should be heat resistance up to at least 100° C. (212° F.) to account for heat generated as a result of the operating conditions of the aircore inductor 72, which may be 300 amperes on average and 1300 amperes at peak operating conditions.

The rectangular prism form factor and inductor coil configuration of the embodiments disclose herein represent a modified toroidal shape which allow for enhanced placement within a scan room and/or equipment room. The inductor coil configuration of the embodiments disclose herein may reduce stray electromagnetic flux by a factor of more than 10 compared to other designs. The integrated cooling of the embodiments disclosed herein allow for additional flexibility in the viable locations in which the aircore inductor 72 may be placed due to enhanced thermal management. Because the aircore inductor 72 does not include a magnetic core, electro-magnetic interference (EMI) with other surrounding electronic and/or electro-magnetic equipment is minimized. The embodiments disclosed herein may be used for transformers and other applications, in addition to the applications discussed above (gradient drivers for MRI systems). For example, the embodiments disclosed herein including the bobbin 130, inductor coil 74, integral cooling passages 116 and/or integral cold plate 122 as well as other components and features may be used in any application including an electrical transformer.

Although specific features of various embodiments of the present disclosure may be shown in some drawings and not in others, this is for convenience only. In accordance with the principles of embodiments of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. An inductor comprising:
   at least one inductor coil, the at least one inductor coil comprising:
   a plurality of outer longitudinal portions forming an outer periphery of the inductor and aligned with one another; and
   a plurality of inner longitudinal portions forming an interior of the inductor and aligned with one another,
   wherein the plurality of outer longitudinal portions and the plurality of inner longitudinal portions collectively form two width-wise side surfaces of the inductor and two length-wise side surfaces of the inductor,
   wherein the two width-wise side surfaces and the two lengthwise side surfaces define a substantially rectangular prism shape, and
   wherein the two width-wise side surfaces and the two lengthwise side surfaces define a hollow inductor core.

2. The inductor of claim 1, wherein an electro-magnetic flux resulting from a charge moving through the at least one inductor coil is confined to a boundary defined by the outer periphery of the inductor.

3. The inductor of claim 1, the at least one inductor coil further comprising:
   an inductor coil first lead for receiving at least one external electrical charge; and
   an inductor coil second lead for dispersing the at least one external electrical charge after it has moved through the inductor coil.

4. The inductor of claim 1, the at least one inductor coil further comprising:
   a plurality of first end portions, the plurality of first end portions connecting the plurality of outer longitudinal portions to the plurality of inner longitudinal portions at a first longitudinal end of the inductor; and
   a plurality of second end portions, the plurality of second end portions connecting the plurality of outer longitudinal portions to the plurality of inner longitudinal portions at a second longitudinal end of the inductor.

5. The inductor of claim 1, the at least one inductor coil further comprising:
   a plurality of corner transition portions, each corner transition portion of the plurality of corner transition portions forming a transition between one of the two width-wise side surfaces and one of the two length-wide side surfaces,
   wherein each corner transition portion of the plurality of corner transition portions is angled between about 30° and 60° relative to at least one of a width-wise direction and a length-wise direction.

6. The inductor of claim 1, wherein the plurality of outer longitudinal portions and the plurality of inner longitudinal portions collectively define an open cavity therebetween.

7. The inductor of claim 6, further comprising at least one integral cooling passage, the at least one integral cooling passage at least partially occupying the open cavity,
   wherein the at least one integral cooling passage wraps around the plurality of inner longitudinal portions at each of the two width-wise surfaces and each of the two length-wide side surfaces.

8. The inductor of claim 7, wherein the at least one integral cooling passage makes between about 2 and about 20 passes around the inductor.

9. The inductor of claim 8, wherein each pass of the at least one integral cooling passage around the inductor is substantially rectangular in shape.

10. The inductor of claim 9, each pass of the at least one integral cooling passage around the inductor further comprising a plurality of 90° bends, wherein each 90° bend of the plurality of 90° bends forms a transition between a portion of the at least one integral cooling passage within one of the two width-wise surfaces and a portion of the at least one integral cooling passage within one of the two length-wide side surfaces.

11. The inductor of claim 1, further comprising at least one cold plate for cooling the at least one inductor coil, the at least one cold plate at least partially occupying the hollow inductor core.

12. The inductor of claim 11, the at least one cold plate further comprising:
   at least one fluid inlet disposed within a first longitudinal end of the cold plate, the at least one fluid inlet fluidly connected to at least one internal passage of the at least one cold plate; and
   at least one fluid outlet disposed within a second longitudinal end of the cold plate, the at least one fluid outlet fluidly connected to the at least one internal passage of the at least one cold plate.

13. The inductor of claim 7, further comprising at least one cold plate for cooling the at least one inductor coil, the at least one cold plate at least partially occupying the hollow inductor core.

14. The inductor of claim 10, further comprising at least one cold plate for cooling the at least one inductor coil, the at least one cold plate at least partially occupying the hollow inductor core, the at least one cold plate further comprising:
   at least one fluid inlet disposed within a first longitudinal end of the cold plate, the at least one fluid inlet fluidly connected to at least one internal passage of the at least one cold plate; and
   at least one fluid outlet disposed within a second longitudinal end of the cold plate, the at least one fluid outlet fluidly connected to the at least one internal passage of the at least one cold plate,
   wherein each width-wise side surface of the two width-wise side surfaces comprises between about 1 and about 10 inner longitudinal portions of the plurality of inner longitudinal portions, and
   wherein each length-wise side surface of the two length-wise side surfaces comprises between about 6 and about 30 inner longitudinal portions of the plurality of inner longitudinal portions.

15. A bobbin comprising:
   two width-wise side surfaces;
   two length-wise side surfaces, the two width-wise side surfaces and the two length-wise side surfaces defining: a substantially rectangular prism shape, and a hollow interior;
   at least one integral cooling passage wrapping around the two width-wise side surfaces and the two length-wise side surfaces, the at least one integral passage structurally connected by and formed integrally with the two width-wise side surfaces and the two length-wise side surfaces, the at least one integral cooling passage comprising:
   a fluid inlet; and
   a fluid outlet,
   wherein the at least one integral cooling passage receives at least one fluid.

16. The bobbin of claim 15, wherein the at least one integral cooling passage makes multiple passes around the two width-wise side surfaces and the two length-wise side surfaces, and
   wherein each of the two width-wise side surfaces and each of the two length-wise side surfaces structurally supports each pass of the at least one integral cooling passage.

17. The bobbin of claim 16, wherein the two width-wise side surfaces, the two length-wise side surfaces, and the at least one integral cooling passage are integrally and concurrently formed via at least one additive manufacturing process.

18. The bobbin of claim 17, the at least one integral cooling passage further comprising:
   at least one passage support;
   an upper longitudinal portion; and
   a lower longitudinal portion,
   wherein the at least one passage support is disposed in the integral cooling passage between the upper longitudinal portion and the lower longitudinal portion.

19. The bobbin of claim 15 further comprising:
   a first plurality of grooves disposed at a first longitudinal end of the bobbin; and
   a second plurality of grooves disposed at a second longitudinal end of the bobbin,
   wherein the first plurality of grooves and the second plurality of grooves receive portions of at least one inductor coil when the at least one inductor coil is wound around the bobbin.

20. An inductor comprising:
   at least one inductor coil, the at least one inductor coil comprising:
      a plurality of outer longitudinal portions forming an outer periphery of the inductor and aligned with one another;
      a plurality of inner longitudinal portions forming an interior of the inductor and aligned with one another; and
      at least one integral cooling feature disposed within the outer periphery of the inductor,
   wherein the plurality of outer longitudinal portions and the plurality of inner longitudinal portions collectively define a substantially rectangular prism shape.

* * * * *